(12) United States Patent
Molina et al.

(10) Patent No.: US 12,266,624 B2
(45) Date of Patent: Apr. 1, 2025

(54) SEMICONDUCTOR DIE WITH SOLDER RESTRAINING WALL

(71) Applicant: Texas Instruments Incorporated, Dallas, TX (US)

(72) Inventors: John Carlo Cruz Molina, Limay (PH); Rafael Jose Lizares Guevara, Manila (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 122 days.

(21) Appl. No.: 17/488,715

(22) Filed: Sep. 29, 2021

(65) Prior Publication Data

US 2023/0106976 A1 Apr. 6, 2023

(51) Int. Cl.
*H01L 23/00* (2006.01)
*H01L 21/56* (2006.01)
*H01L 23/31* (2006.01)

(52) U.S. Cl.
CPC ............ *H01L 24/16* (2013.01); *H01L 21/563* (2013.01); *H01L 23/3128* (2013.01); *H01L 24/03* (2013.01); *H01L 24/06* (2013.01); *H01L 24/48* (2013.01); *H01L 2224/02235* (2013.01); *H01L 2224/0225* (2013.01); *H01L 2224/02255* (2013.01); *H01L 2224/0226* (2013.01); *H01L 2224/03013* (2013.01); *H01L 2224/0401* (2013.01); *H01L 2224/06131* (2013.01); *H01L 2224/10126* (2013.01); *H01L 2224/16145* (2013.01); *H01L 2224/48247* (2013.01)

(58) Field of Classification Search
CPC . H01L 2224/03013; H01L 2224/02235; H01L 2224/48247; H01L 2224/16145; H01L 2224/0225; H01L 2224/0401; H01L 2224/06131; H01L 2224/32245; H01L 2224/48465; H01L 2224/73207; H01L 2224/81007; H01L 2225/06513; H01L 23/3107; H01L 23/481; H01L 21/563; H01L 21/56; H01L 2924/181; H01L 24/48; H01L 24/13; H01L 24/06; H01L 24/03
USPC ................................. 257/668, 666; 438/123
See application file for complete search history.

(56) References Cited

U.S. PATENT DOCUMENTS

| | | | | |
|---|---|---|---|---|
| 8,228,682 B1 * | 7/2012 | Zohni | ..................... | H01G 4/228 257/737 |
| 10,593,640 B2 | 3/2020 | Baello et al. | | |
| 2003/0141582 A1 * | 7/2003 | Yang | ..................... | H01L 24/73 257/E23.079 |
| 2004/0046264 A1 * | 3/2004 | Ho | ..................... | H01L 21/563 257/E21.503 |
| 2006/0043557 A1 * | 3/2006 | Saran | ..................... | H01L 23/50 257/E23.079 |
| 2011/0068427 A1 * | 3/2011 | Paek | ..................... | H01L 24/20 257/E21.705 |

(Continued)

*Primary Examiner* — Didarul A Mazumder (74) *Attorney, Agent, or Firm* — Ronald O. Neerings; Frank D. Cimino (57) ABSTRACT

A semiconductor die includes a semiconductor surface including circuitry electrically connected to top-level bond pads exposed on a top surface of the semiconductor die, the top-level bond pads including inner bond pads and outer bond pads positioned beyond the inner bond pads. There is solder on at least the inner bond pads. A ring structure is positioned around a location of at least the inner bond pads.

22 Claims, 8 Drawing Sheets

(56) References Cited

U.S. PATENT DOCUMENTS

| | | | |
|---|---|---|---|
| 2012/0211884 A1* | 8/2012 | Stepniak | H01L 24/03 |
| | | | 257/E21.477 |
| 2013/0001776 A1* | 1/2013 | Yu | H01L 24/97 |
| | | | 257/E23.021 |
| 2013/0062761 A1* | 3/2013 | Lin | H01L 21/565 |
| | | | 257/737 |
| 2017/0229405 A1* | 8/2017 | Williamson | H01L 24/14 |
| 2018/0286793 A1* | 10/2018 | Cheng | H01L 25/105 |
| 2020/0312789 A1* | 10/2020 | Kim | H01L 23/367 |

\* cited by examiner

SEMICONDUCTOR DIE WITH SOLDER RESTRAINING WALL

FIELD

This Disclosure relates to semiconductor die that include solder on bond pads, including package-on-package (POP) devices including a semiconductor die having a solder connection to another semiconductor device or a semiconductor package.

BACKGROUND

Hybrid semiconductor packages or devices include 2 more different devices, generally including at least one semiconductor die, where the different devices may be stacked on one another. One example of a hybrid semiconductor package comprises a Package on a Package (POP) which is an integrated circuit (IC) packaging method and device arrangement that combines a bottom package including at least a first semiconductor die and a top package or top die(s), where the top package or top die(s) is vertically stacked above the bottom package, generally having a standard interface to route signals between the respective packages.

This interface is normally implemented using a solder connection, such as the solder comprising SnAg. A POP allows higher component density in devices, such as for mobile phones, personal digital assistants (PDA), and digital cameras, with generally a minor disadvantage of a slightly higher package height requirement as compared to a single package. POP stacks with more than 2 stacked packages or die are uncommon due to heat dissipation considerations downward through the stack.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize for semiconductor die having solder connections for electrical connections to a package substrate or to a top package or top die(s), problems can occur including during solder ball collapse. The semiconductor die can comprise a wafer chip scale package (WCSP) die generally including on its top side at least one redistribution layer (RDL) that provides bond pads having solder thereon which is mounted top side up onto a package substrate, such as for example on a die pad of a leadframe. The solder ball collapse can lead to solder bridging between solder on adjacent bond pads on the semiconductor die, especially if pitch of the solder is relatively tight.

The semiconductor die can comprise a through-silicon via (TSV) die having solder on its bond pads, or a flipchip die having solder on its bond pads. In either of these arrangements, bond wires are not needed. Moreover, in either these arrangements there is recognized to be a risk of neighboring solder bumps bridging, again especially if the pitch of the solder is relatively tight.

A second recognized solder associated problem in the case there is a top semiconductor package or top die on a semiconductor die having solder on its bond pads can be the top semiconductor package or top die tilting after its attachment to the semiconductor die. Disclosed aspects also recognize the lack of sufficient solder process control or process margin during attaching of the top semiconductor package or top die to solder on bond pads of a semiconductor die can result from high assembly process operating temperatures. For example, the semiconductor die generally also needs an electrical connection to a package substrate underneath, such as to leads of a leadframe using wirebonding which generally involves a relatively high temperature, such as 250° C.+/−10° C. This relatively high assembly temperature used for wirebonding can also affect solder ball reformation or collapse, which can result in solder bridging problems between adjacent bond pads on the semiconductor die used for the solder connections between the semiconductor die and the top semiconductor package or top die.

Disclosed aspects include forming what is termed a ring structure around at least the solder locations on the semiconductor die that will be involved in a solder connection onto a package substrate or to a top semiconductor package or top die, implemented before the solder ball drop process. The ring structure generally comprises a metal (or metal alloy) such as copper, which is electrically isolated from the bonding features of the top semiconductor package or top die, such as lead terminals of a quad flat no leads (QFN) package. The ring structure particularly when it comprises a metal such as copper is mechanically rigid so that it provides a rigid standoff in the case of a top semiconductor package or top die during the top semiconductor package or top die attach to the semiconductor die which helps to solve the above-described problem regarding solder ball collapse. The ring structure around the respective solder locations on at least the inner bond pads of the semiconductor die that are involved in the electrical connection to the package substrate or top semiconductor package or top die enables electrical isolation of adjacent solder by creating a generally fully enclosed wall that restrains the solder during solder reformation/collapse that can otherwise occur during the relatively high temperature assembly processes such as the wirebonding process.

The solder on bond pads of the semiconductor die (e.g., WCSP die) that lack a disclosed ring structure can be wirebonded to the leads of the leadframe when the package substrate comprises a leadframe. Disclosed ring structures also can provide a rigid protruding standoff (protruding from the top dielectric layer, such as a polyamide (PI) layer in the case of a WCSP die) in the case of a top semiconductor package or top die preventing tilting during top semiconductor package/top die attach to the semiconductor die. Without a disclosed ring structure providing a rigid protruding standoff the top semiconductor package/top die can experience tilting due to inconsistent solder ball collapse which can result in reliability and yield problems including top semiconductor package/top die cracking and the failure for the solder connection to properly wet.

Disclosed aspects include a semiconductor die comprising a semiconductor surface including circuitry electrically connected to top-level bond pads exposed on a top surface of the semiconductor die, the top-level bond pads including inner bond pads and outer bond pads positioned beyond the inner bond pads. There is solder on at least the inner bond pads. A ring structure is positioned around a location of at least the inner bond pads.

Disclosed aspects also include semiconductor devices including a POP device comprising a package substrate (e.g. leadframe, molded interconnect substrate (MIS) or a printed circuit board (PCB)) and a semiconductor die mounted on the package substrate. The semiconductor die includes circuitry electrically connected to bond pads including inner bond pads and outer bond pads positioned beyond the inner bond pads, including solder on at least the inner bond pads. A ring structure is positioned around a location of at least the inner bond pads. A top semiconductor package or top die includes bonding features, where the bonding features are flipchip attached to the solder on the inner bond pads. A mold compound encapsulates at least the semiconductor die.

BRIEF DESCRIPTION OF THE DRAWINGS

Reference will now be made to the accompanying drawings, which are not necessarily drawn to scale, wherein:

FIGS. 1A-1I are successive mainly cross-sectional views of a semiconductor die shown as being a WCSP die showing example steps in forming a disclosed ring structure for bond pads in a mounting area, then forming solder balls on the bond pads-a. For a WCSP die the top-level bond pads generally have a top under-bump metallization (UBM) layer on a seed layer on a pad area provided by a RDL, that is on a die bond pad that is over a passivation aperture of a passivation layer.

FIGS. 2A-2G show the results with cross-sectional views after steps in an example PoP assembly process where the package substrate comprises a leadframe, the semiconductor die comprises a WCSP die including a ring structure positioned in the mountable area, and the top semiconductor package or top die comprises a vertical cavity surface emitting laser (VCSEL). The cross-sectional view of the WCSP die corresponds to the cut line shown in FIG. 1G as 2A-2A except that the outermost bond pads are not shown.

FIG. 3 is a cross-sectional view of an example semiconductor packaged device shown as a PoP device, according to an example aspect. PoP device comprises a multilayer package substrate. Attached face up to the multilayer package substrate is a semiconductor die again shown as a WCSP die. The inner bond pads in the mountable area of the WCSP die include a disclosed ring structure. Flipchip attached in the mountable area is a top semiconductor package or top die. The solder is shown assembled onto the bond pads of the WCSP die having solder thereon including a disclosed ring structure.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

As used herein, a 'ring', such as used herein in the term "ring structure", means an enclosed shape, such as being circular or substantially circular, elliptical, rectangular, or square shaped. Although the ring structure is generally described as being a fully continuous ring (no gaps), it is also possible for a disclosed ring structure to have small gaps, such as on the order of 0.1 µm (or less if able to form smaller gaps) to about 0.8 µm, where the size the gaps are small enough so that the surface tension of the flowing solder prevents the solder from flowing through the gaps.

The ring structure can comprise a metal such as copper or a copper alloy, or an electrically non-conductive/dielectric material such as a cured polymer. This variety of material types is possible because the main purpose of the ring structure is to act as a restraint or standoff for keeping the solder following solder collapse contained within.

FIGS. 1A-1I are successive mainly cross-sectional views of a semiconductor die shown as being a WCSP die showing example steps in forming a ring structure for bond pads in a mounting area for the WCSP die, then forming solder balls on the bond pads of the WCSP die. For a WCSP die the top-level bond pads generally have a UBM layer on a seed layer on a bond pad area provided by a RDL, that is on a die bond pad that is over a passivation aperture of a passivation layer. For simplicity only a single bond pad is shown.

Figure 1A:
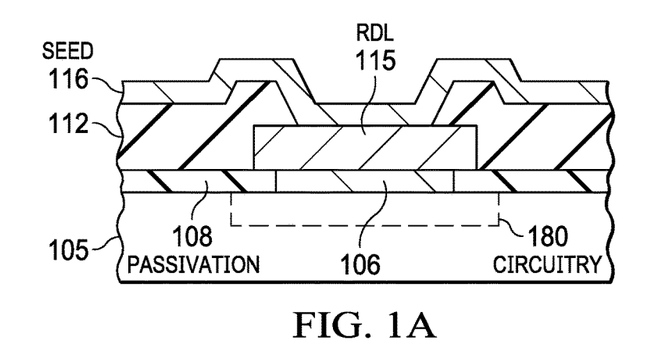
FIG. 1A shows an in-process WCSP die comprising a substrate including circuitry, where the in-process WCSP die has largely completed wafer fabrication processing and includes a top metal layer that provides a plurality of die bond pads that are each connected by a trace provided by at least one RDL above the passivation layer that is on (or alongside) a top metal layer, after forming a dielectric on the RDL.

FIG. 1A shows an in-process WCSP die comprising a substrate 105 (e.g., silicon) including circuitry 180 shown by a dashed rectangle configured together for implementing a function, generally with a multilayer metal stacked thereon, having at least one passivation layer on the metal stack, with the passivation layer shown as 108. The passivation layer 108 has apertures exposing the die bond pads 106, where the in-process WCSP die has largely completed wafer fabrication processing, where the die bond pads 106 are each connected by a trace of the RDL to a bond pad area over the die bond pad 106 shown as RDL 115, after forming a dielectric layer 112 that can comprise a polyimide layer (PI layer) on the RDL 115. On the surface of the in-process WCSP die is a seed layer 116 shown as a blanket (un-patterned) layer. The seed layer 116 can comprise TiW/Cu.

Figure 1B:
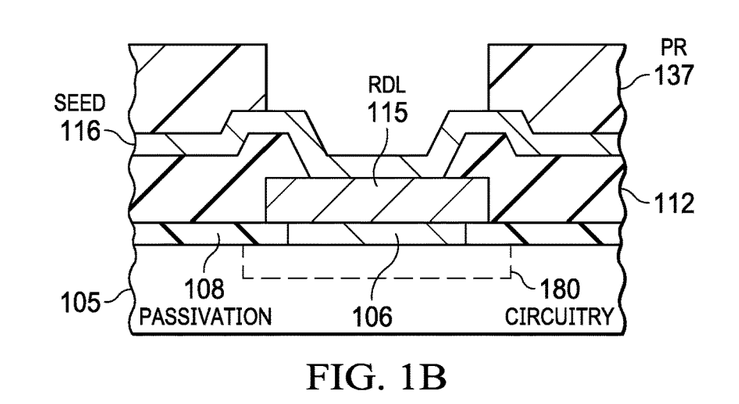
FIG. 1B shows results after photoresist patterning before formation of the UBM layer, that can be an optional layer.
Figure 1C:
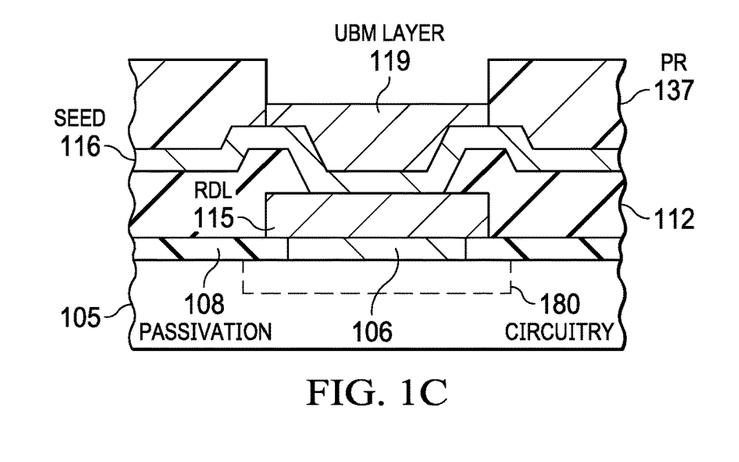
FIG. 1C shows results after plating of the UBM layer. The PR layer is then stripped off.
Figure 1D:
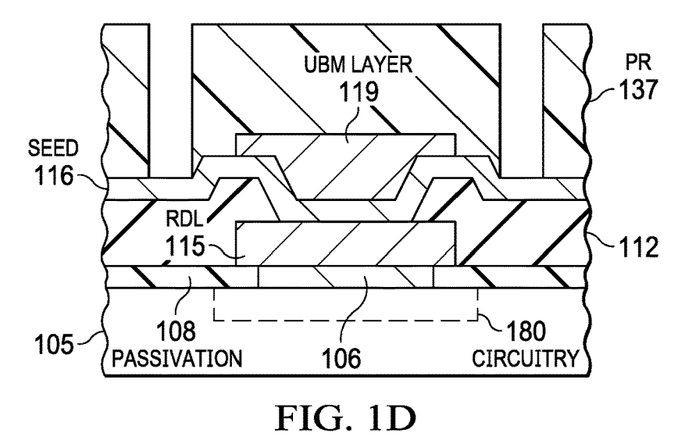
FIG. 1D shows results after forming a PR pattern that will be used for defining the position of ring structures around the bond pads.

FIG. 1B shows results after PR patterning shown as a PR layer 137 before formation of the UBM layer. FIG. 1C shows results after plating of the UBM layer shown as 119. The PR layer 137 is then stripped off. FIG. 1D shows results after forming a PR layer again shown as 137 that will be used for defining the position of a ring structures around the bond pad area provided by the RDL 115 above the die bond pad 106.

Figure 1E:
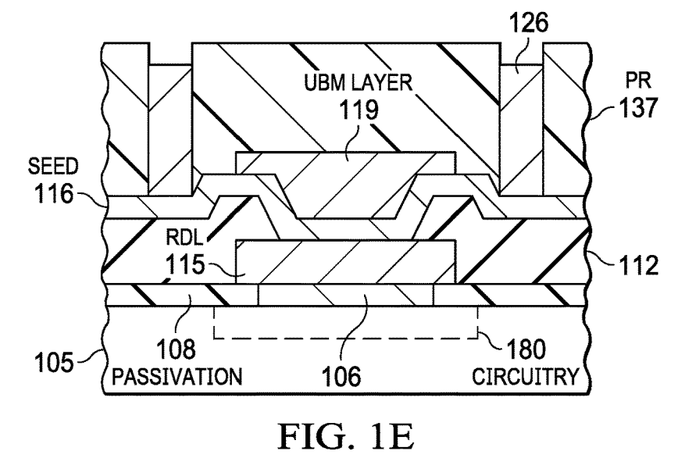
FIG. 1E shows results after plating to form a ring structure, which can comprise copper.

FIG. 1E shows results after plating to form a ring structure 126, which as noted above can comprise copper. The ring structure generally has a height from 50 µm to 180 µm measured from the top of the dielectric layer 112, and generally has a width from 50 µm to 200 µm. The specific height of the ring structure 126 is dependent on the solder ball diameter being used. The height of the ring structure 126 is generally slightly less when compared to the solder ball height.

A height of the ring structure 126 that is less than 50 µm generally results in the solder not being able to be controlled properly, and a height of the ring structure 126 more than about 180 µm will increase the risk of the solder not wetting properly. If the height of the ring structure 126 is less than 50 µm, then during top semiconductor package or top die attach, solder can collapse and move out of the region of control since the wall provided by the ring structure 126 is too short. Also, if the wall provided by the ring structure 126 is too short, it is unlikely one can gain benefits of preventing top semiconductor package or top die tilting. If the height is greater than about 180 µm, then the wall provided by the ring structure 126 can prevent the top semiconductor package or top die from attaching correctly to the solder or if ever, and only minimal solder may wet since the ring structure 126 may be too tall. Regarding the minimum width of 50 µm for the ring structure 126, this minimum width is generally to enable supporting the ring structure 126 properly both on a structural standpoint and manufacturability standpoint.

Figure 1F:
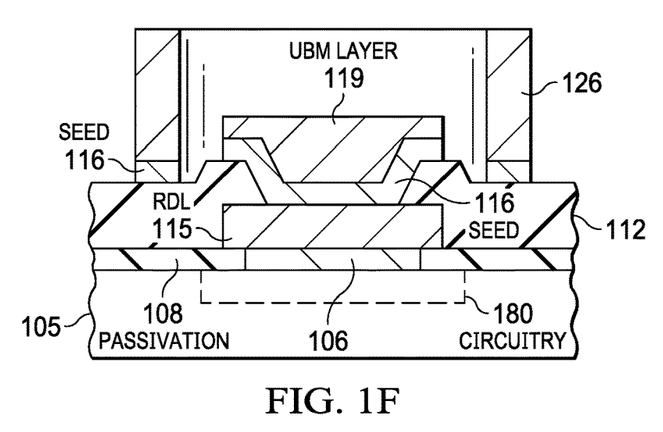
FIG. 1F shows results after stripping off the PR pattern and etching of the seed layer. Between the 2 posts shown depicting the ring structure is the back of the ring structure.
Figure 1G:
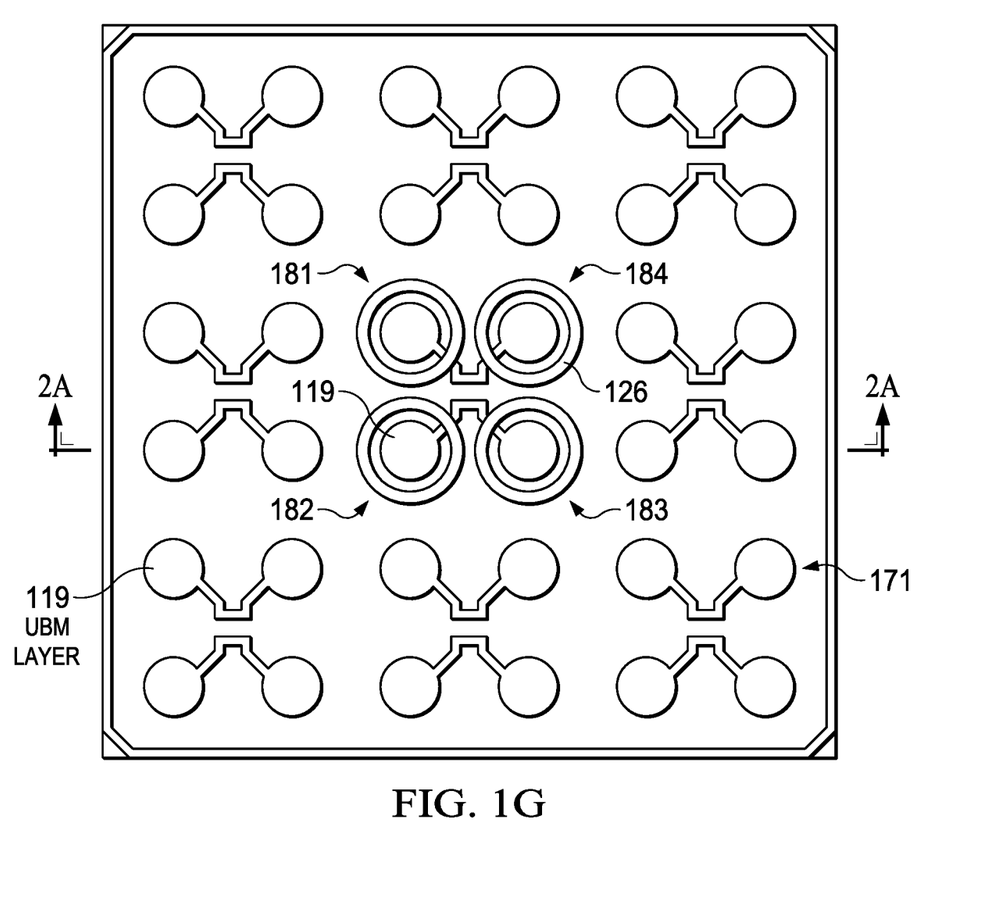
FIG. 1G shows a top view of the structure corresponding to FIG. 1F after stripping off the PR pattern and etching of the seed layer, showing the mounting area having a ring structure around the respective inner bond pads. The ring structure is shown providing a fully continuous encirclement around the inner bond pads. In this example the mountable area on the semiconductor die is configured for a 2×2 solder ball matrix, so only 4 solder balls are shown having a disclosed ring structure.

FIG. 1F shows results after stripping off the PR layer 137 and etching of the seed layer 116. Between the 2 posts shown depicting the ring structure 126 is the back of the ring structure. FIG. 1G shows a top view of the structure corresponding to FIG. 1F after stripping off the PR layer 137 and etching of the seed layer 116, showing the mounting area having a ring structure around the UBM layer 119 of the respective inner bond pads shown as 181, 182, 183 and 184 which may be considered to be positioned in a mounting area. The other bond pads shown are outer bond pads, with a single outer bond pad shown as 171. The position of the mountable area is generally defined by the bonding features on the top semiconductor package/top die that are to be electrically connected to the semiconductor die.

Figure 1H:
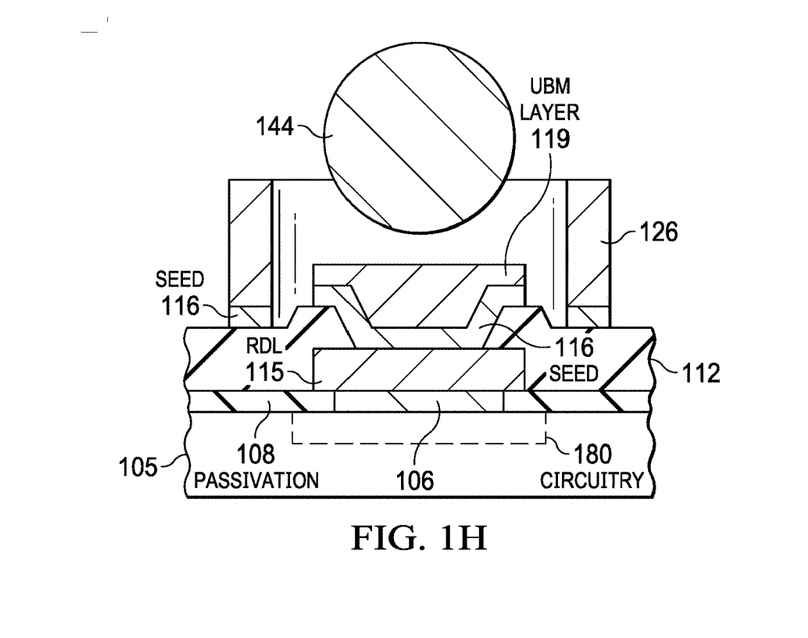
FIG. 1H shows results after dropping of a solder ball within the ring structure 126 and onto the UBM layer for each of the bond pads.

The ring structure 126 is shown providing a fully continuous encirclement around the inner bond pads. In this example the mountable area on the bottom semiconductor package is for a 2×2 solder ball matrix, so that only 4 solder balls are shown in FIG. 1H described below above the UBM layer 119 having a disclosed ring structure 126. The connections shown in FIG. 1G between adjacent inner bond pads 181, 182, 183 and 184 are intended to represent internal circuitry on the WCSP shown above as 180 on the WCSP die.

Figure 1I:
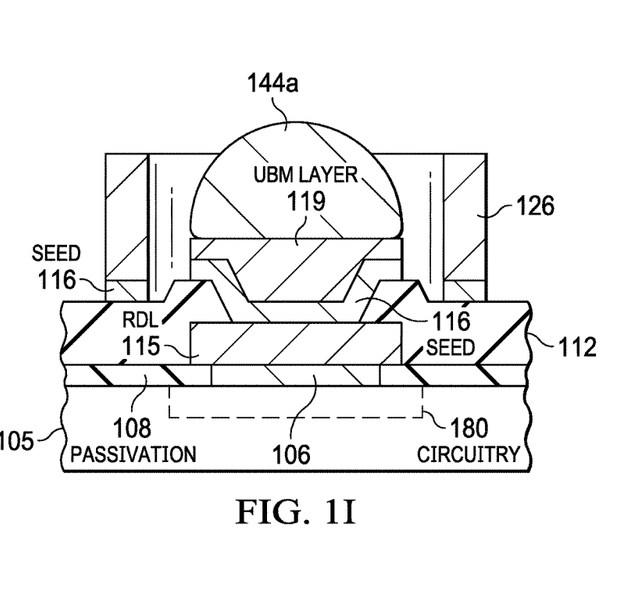
FIG. 1I shows results after solder reflow, where the final height of the solder ball after reflow is depicted as being slightly taller in height as compared to the height of the ring structure to facilitate making electrical connections to bonding features of a top semiconductor package or top die.

FIG. 1H shows results after dropping (depositing) of a solder ball 144 within the ring structure 126 and onto the UBM layer 119 over each of the die bond pads 106. FIG. 1I shows results after solder reflow, where the final solder height of the solder ball after reflow shown as solder ball 144a is depicted as being slightly taller in height as compared to the ring structure 126. This feature facilitates making electrical connections to bonding features of a top semiconductor package or a top semiconductor die.

FIGS. 2A-G shows the results with cross-sectional views after steps in an example POP assembly process where the package substrate comprises a leadframe, the semiconductor die comprises a WCSP die 170 including a ring structure 126 positioned around the solder in the mountable area, and the top semiconductor package or top die comprises a VCSEL die. The cross-sectional view of the WCSP die 170 corresponds to the cut line shown in FIG. 1G as 2A-2A except that the outermost bond pads are not shown.

Figure 2A:
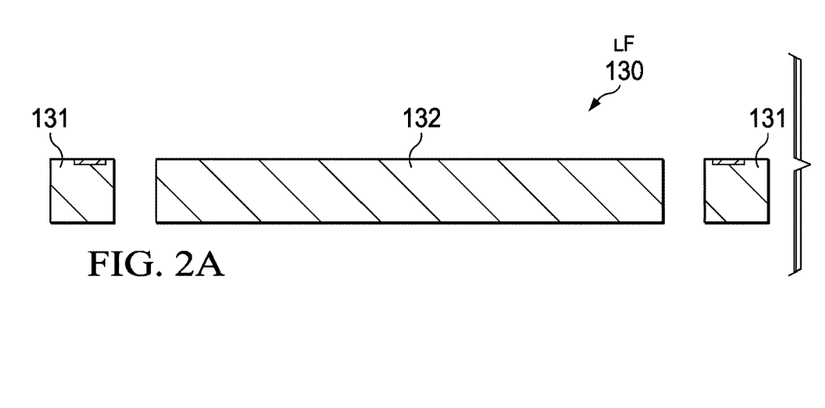
FIG. 2A shows a cross-sectional view of the WCSP die alongside the leadframe (LF) to be used in this example assembly process/method. The WCSP die is shown including outer bond pads, and inner bond pads that are located in the mounting area.
Figure 2B:
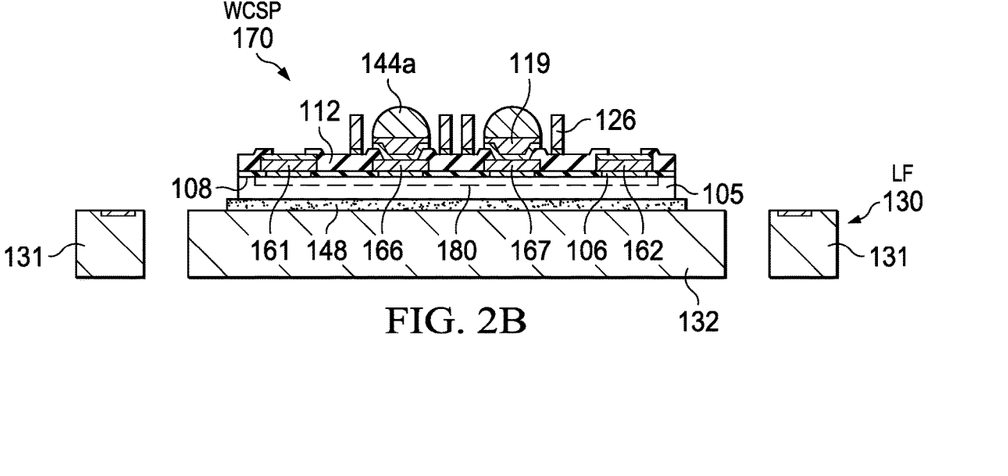
FIG. 2B shows a cross-sectional view following a die attach process for attaching the WCSP die to the die pad of the leadframe.

FIG. 2A shows a cross-sectional view of the WCSP die 170 and the LF 130 including a die pad 132, and leads 131 to be used in this example assembly process/method. The WCSP die 170 is shown including outer bond pads 161, 162 and inner bond pads 166, 167 having a solder ball 144 thereon that are located in the mounting area. The ring structure 126 can be seen to provide a protruding standoff (protruding above the dielectric layer 112) that functions as a restraining wall when the solder ball collapses due to relatively high assembly processing temperatures, such as during the wirebonding step described below that follows the die attachment of the WCSP die 170 to the die pad 132 of the LF 130. FIG. 2B shows a cross-sectional view following a die attach process for attaching the WCSP die 170 with its top side up onto the die pad 132 of the LF 130, where the die attach material is shown as 148.

Figure 2C:
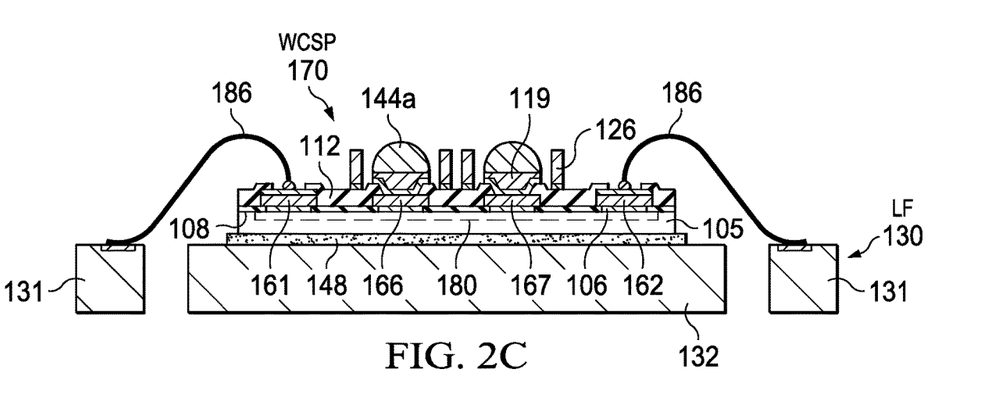
FIG. 2C shows a cross-sectional view following wirebonding the outer bond pads to leads of a leadframe.

FIG. 2C shows a cross-sectional view following wirebonding the outer bond pads 161, 162 both shown as non-ringed bond pads to the leads 131, where the bond wires are shown as 186. The outer bond pads 161, 162 may or may not have solder thereon, where whether the solder bumping process will also place on the outer bond pads 161, 162 may depend on the bonding feature arrangement of the top semiconductor package/top die that will be assembled on solder on top of the inner bond pads 166, 167 of the WCSP die 170. The outer bond pads 161, 162 can comprise bond over active circuit (BOAC) pads that in one arrangement can comprise Cu/Ni/Pd so that they are adapted for wirebonding to the leads 131.

Figure 2D:
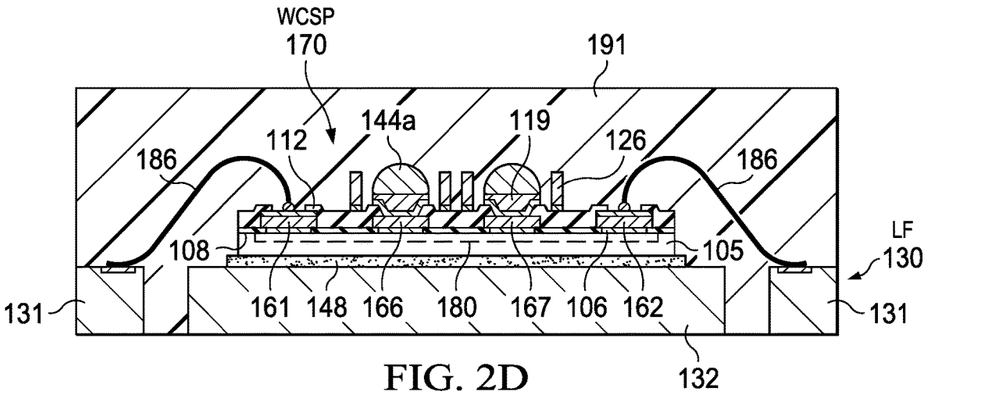
FIG. 2D shows a cross-sectional view following molding to form a mold compound.
Figure 2E:
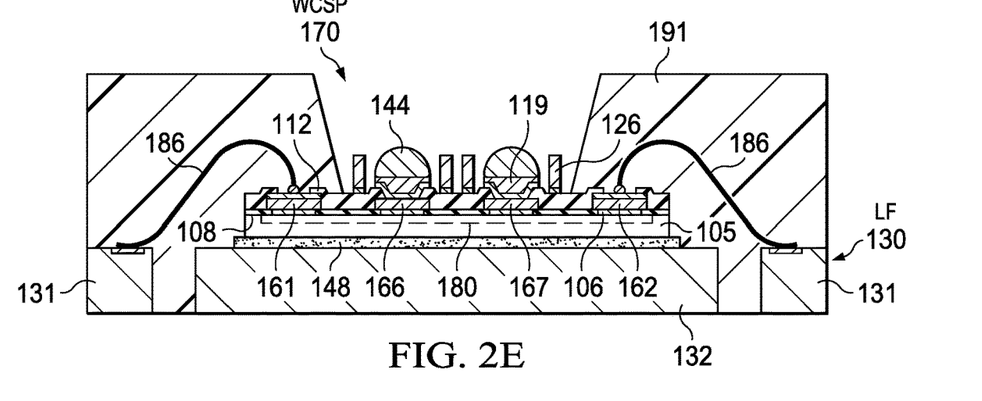
FIG. 2E shows a cross-sectional view following a laser ablation process as an example process to remove a portion of the mold compound provide an open cavity above the mountable area of the WCSP die.
Figure 2F:
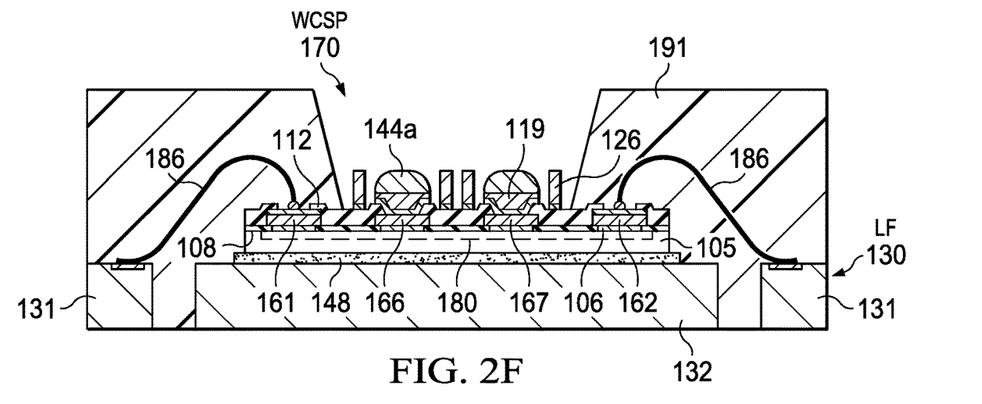
FIG. 2F shows a cross-sectional view following what may be termed solder collapse after a thermal process.
Figure 2G:
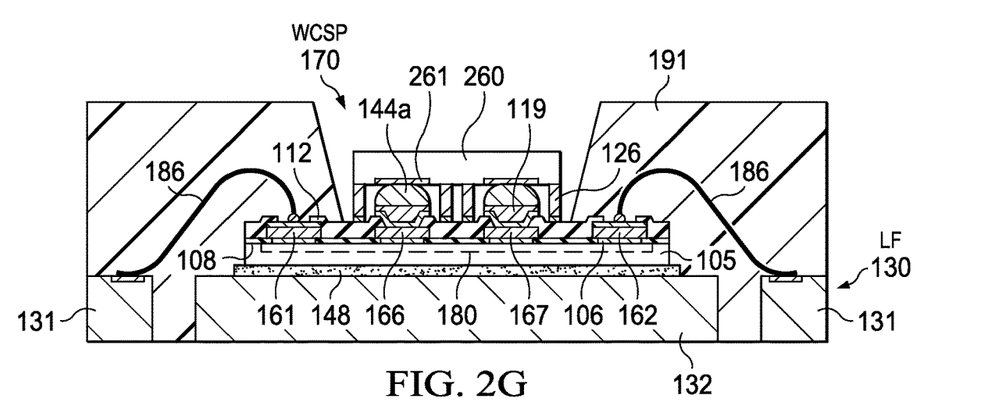
FIG. 2G shows a cross-sectional view following the die attach of a top semiconductor package or top die shown as a top die being a flipchip attachment of a device such as a VCSEL die onto the solder on the inner bond pads.

FIG. 2D shows a cross-sectional view following molding to form a mold compound shown as 191. FIG. 2E shows a cross-sectional view following a laser ablation process as an example optional process to remove an area of the mold compound 191 to provide an open cavity above the mountable area of the WCSP die 170 that is generally provided when the top semiconductor package or top die is a light-emitting device, such as a VCSEL die. FIG. 2F shows a cross-sectional view following what may be termed solder collapse after a process such as solder reflow or bake, where the inner solder ball is shown as 144a. FIG. 2G shows a cross-sectional view following die attach of a top semiconductor package or top die shown as a VCSEL die 260 being a flipchip attachment of bond pads 261 onto the inner solder ball 144a above the inner bond pads 166, 167 of the WCSP die 170. For the cases where the top semiconductor package or top die is not light-emitting, a second molding process can be used to encapsulate the top semiconductor package or top die, or the laser ablation step described above can be omitted.

Figure 3:
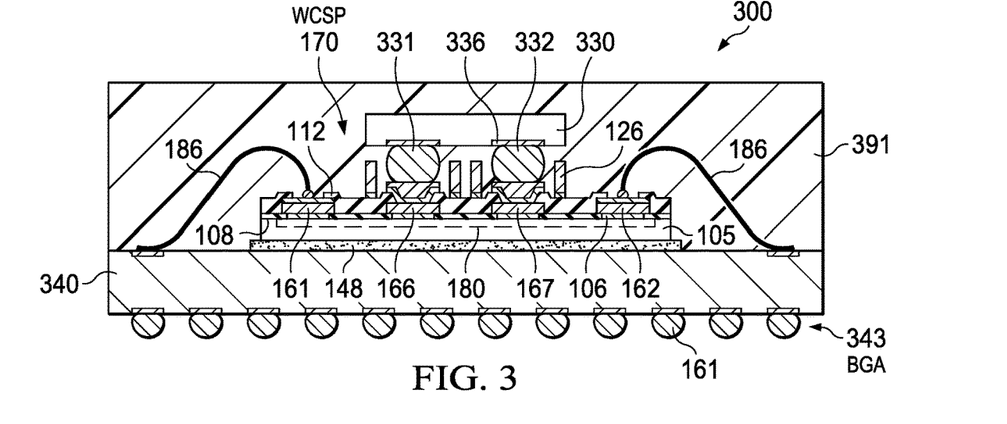

FIG. 3 is a cross-sectional view of an example POP device 300, according to an example aspect. PoP device 300 comprises a multilayer package substrate 340 such as a MIS or PCB having a ball grid array (BGA) 343 on its bottom side. Connections from a top side of the multilayer package substrate 340 that are generally present and not shown in FIG. 3. Attached face up to the multilayer package substrate 340 is a semiconductor die again shown as a WCSP die 170. Flipchip attached in the mountable area of the WCSP die 170 is a top semiconductor package or top die shown as top die 330 including bond pads 336. The mold compound is shown as 391 is generally formed from a first and a second molding process, where the second molding process is an optional process to close the mold cavity on top of the top semiconductor package or top die. The top semiconductor die's 330 bond pads 336 that contact the solder balls 331, 332 on the inner bond pads 166, 167, where the connection can vary depending on the particular application. The solder balls 331, 332 each have an associated ring structure 126. For example, the top semiconductor package or top die can comprise a passive device, such as a capacitor, resistor, inductor, another WCSP die, or a sensor die.

Figure 4:
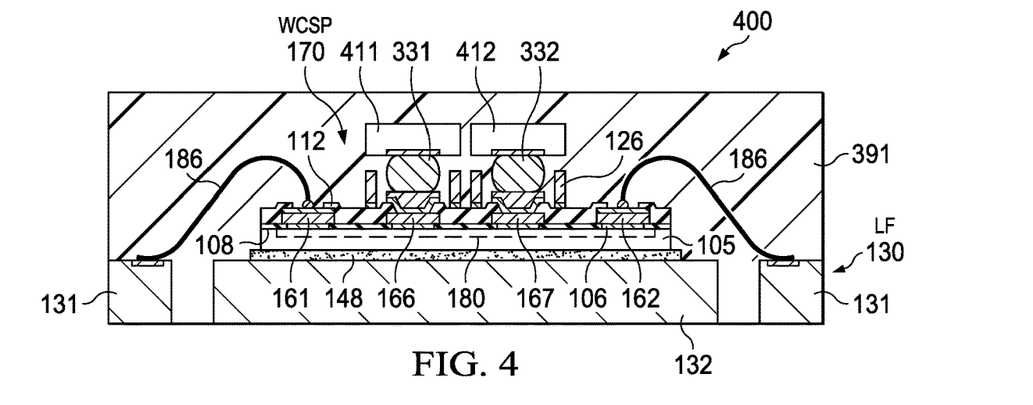
FIG. 4 is a cross-sectional view of an example POP device including a WCSP die that has a ring structure around the inner bond pads, according to an example aspect. PoP device comprises a leadframe as the package substrate. Attached face up to the leadframe is a semiconductor die again shown as a WCSP die. The inner bond pads in the mountable area of the WCSP die include a disclosed ring structure. Flipchip attached in the mountable area of the WCSP die is a first and a second top semiconductor package or top die shown as a first top die and a second top die.

FIG. 4 is a cross-sectional view of an example POP device 400, according to an example aspect. PoP device 400 comprises a LF 130 as the package substrate. Attached face up to the leadframe is a semiconductor die again shown as a WCSP die 170. Flipchip attached in the mountable area of the WCSP die 170 is a first and a second top semiconductor package or top die shown as a first top die 411 and a second top die 412 that are generally different dies.

Figure 5:
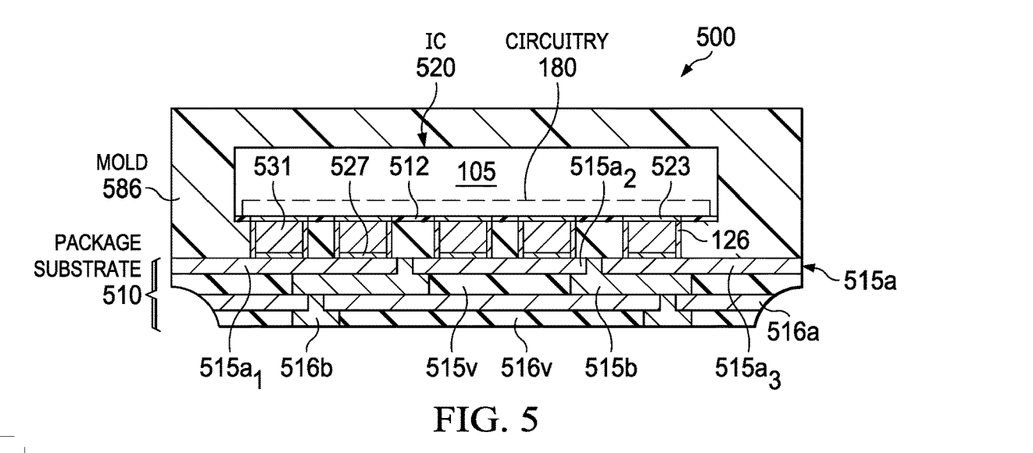
FIG. 5 is a cross-sectional view of an example POP device that includes a flipchip mounted semiconductor die shown as an IC mounted on a package substrate, where the IC that includes a ring structure around each of the bond pads, according to an example aspect.

FIG. 5 is a cross-sectional view of an example POP device 500 that includes a flipchip mounted semiconductor die shown as IC 520 comprising a substrate 105 including circuitry 180 coupled to bond pads shown as 523 having solder 531 thereon mounted onto a package substrate 510. The IC 520 includes a ring structure 126 on a passivation layer 512 around each of the bond pads 523. For an IC die such as IC 520, the top-level metal provides the bond pads 523 that may be termed die bond pads. The mold compound is shown as 586.

The package substrate 510 is shown having two levels, with a top level including a dielectric layer shown as 515b and a top metal level 515a that includes metal features 515a1, 515a2, and by 515a3. There is an electrically conductive die attach material 527 shown between the solder 531 and the metal features 515a1, 515a2, and 515a3. The bottom level of the package substrate 510 is shown including a dielectric layer 516b, and a bottom metal layer 516a that includes metal features 515a1, 515a2, and by 515a3. There are also filled vias shown as 515v that electrically connect the respective metal layers. The bottom layer also includes filled vias 516v for providing a bottom side connection for the POP device 500.

Figure 6A:
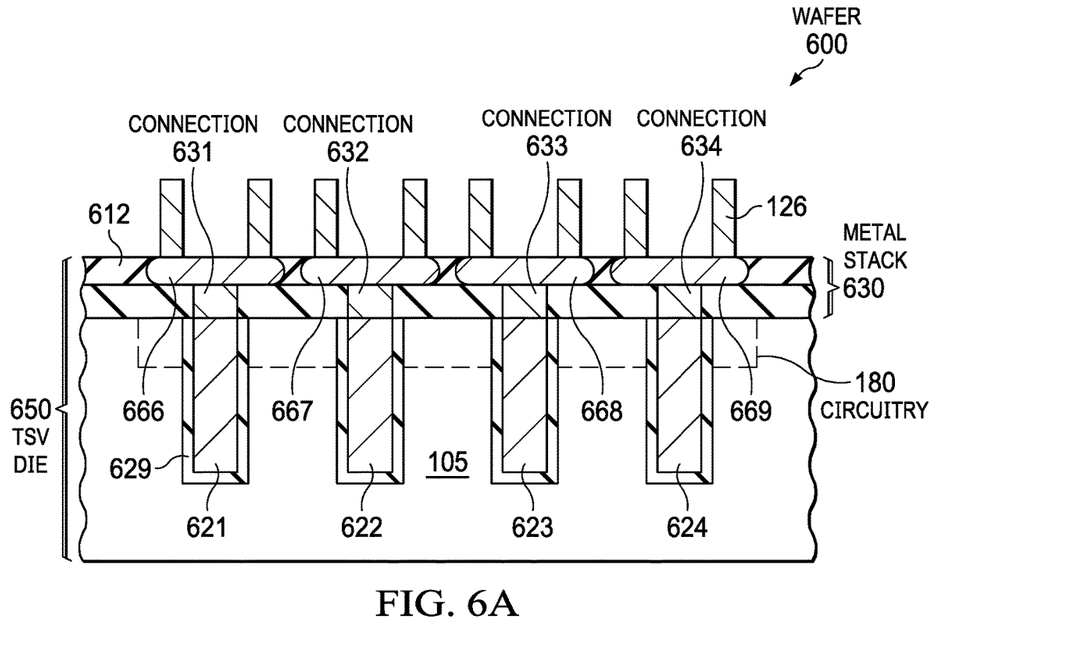
FIG. 6A is a cross-sectional view of a portion of a wafer having a plurality of TSV die with a single TSV die shown having TSVs, after forming a ring structure around an outer edge of the die bond pads. At this point in the processing the TSVs have not yet been exposed on the bottom side of the wafer.

FIG. 6A is a cross-sectional view of a portion of a wafer 600 having a plurality of TSV die with a single TSV die 650 shown having TSVs 621, 622, 623, and 624, the TSVs including dielectric layer 629 framing the respective TSVs for electrically isolating the TSVs, from the substrate 105, after forming a ring structure 126 (such as by plating) around an outer edge of the die bond pads 666, 667, 668 and 669, according to an example aspect. The die bond pads 666, 667, 668 and 669 are on a top side of the metal stack 630, where the die bond pads are positioned within apertures of a passivation layer 612 are electrically connected to the TSVs 621, 622, 623, and 624 by the connections 631, 632, 633, and 634 through the metal stack 630.

Figure 6B:
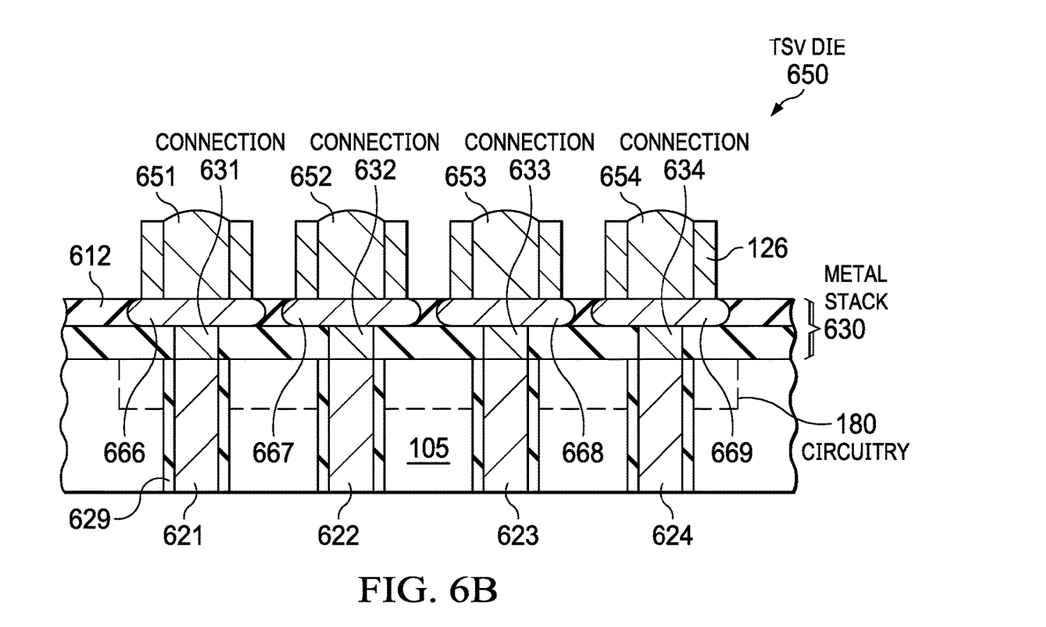
FIG. 6B is a cross-sectional view of the TSV die after forming solder balls within the ring structures, back grinding to expose the TSVs on a bottom side of the wafer, and then singulation of the wafer into a plurality of the TSV die.

The metal stack 630 generally includes metal filled vias through the dielectric layers (interlayer dielectric (ILD) layers) of the metal stack 630, where the connections 631, 632, 633, and 634 electrically connect the die bond pads 666, 667, 668 and 669 to the TSVs 621, 622, 623, and 624. At this point in the processing the TSVs 621, 622, 623, and 624 have not yet been exposed on the bottom side of the wafer 600. FIG. 6B is a cross-sectional view of the TSV die 650, after forming solder balls within the ring structures 126, back grinding to expose the TSVs 621, 622, 623, and 624 on a bottom side of the TSV die 650, and then singulation of the wafer 600 to produce a plurality of the TSV die 650. The ring structures 126 can be seen to be around solder balls 651, 652, 653 and 654, that are on the die bond pads 666, 667, 668 and 669, respectively.

Disclosed aspects can be integrated into a variety of assembly flows to form a variety of different semiconductor die, semiconductor packages including POP packages and related products. The semiconductor package can comprise single IC die or multiple IC die, such as configurations comprising a plurality of stacked IC die, or laterally positioned IC die. A variety of package substrates may be used. The semiconductor die such as an IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A semiconductor die, comprising:
a semiconductor surface comprising circuitry electrically connected to top-level bond pads exposed on a top surface of the semiconductor die, the top-level bond pads including inner bond pads and outer bond pads positioned beyond the inner bond pads, with solder on at least the inner bond pads; and
a continuous ring structure positioned around a location of at least one of the inner bond pads.

2. The semiconductor die of claim 1, wherein the ring structure has a height of 50 μm to 180 μm and a width from 50 μm to 200 μm.

3. A semiconductor die, comprising:
a semiconductor surface comprising circuitry electrically connected to top-level bond pads exposed on a top surface of the semiconductor die, the top-level bond pads including inner bond pads and outer bond pads positioned beyond the inner bond pads, with solder on at least the inner bond pads; and
a ring structure positioned around a location of at least the inner bond pads, wherein the semiconductor die comprises a wafer chip scale package (WCSP) die including a redirect layer (RDL) that provides the inner bond pads and the outer bond pads which are electrically connected to die bond pads that are electrically connected to the circuitry.

4. The semiconductor die of claim 1, wherein the semiconductor die includes a top layer metal that includes die bond pads which provide the inner bond pads and the outer bond pads that are both electrically connected to the circuitry.

5. The semiconductor die of claim 1, wherein the ring structure provides a fully continuous encirclement.

6. A semiconductor die, comprising:
a semiconductor surface comprising circuitry electrically connected to top-level bond pads exposed on a top surface of the semiconductor die, the top-level bond pads including inner bond pads and outer bond pads positioned beyond the inner bond pads, with solder on at least the inner bond pads; and
a ring structure positioned around a location of at least the inner bond pads, wherein the semiconductor die comprises a through silicon via (TSV) die including a top layer metal that comprises die bond pads which provides the inner bond pads and the outer bond pads that are both electrically connected to the circuitry.

7. A semiconductor device, comprising:
a package substrate;
a semiconductor die including a semiconductor surface comprising circuitry electrically connected to top-level bond pads, the top-level bond pads including inner bond pads and outer bond pads positioned beyond the inner bond pads, with solder on at least the inner bond pads, with the semiconductor die attached to the package substrate; and
individual ring structures positioned around locations of at least the inner bond pads.

8. The semiconductor device of claim 7, further comprising a top semiconductor package or top die including bonding features, where the bonding features are flipchip attached to the solder on the inner bond pads, and
a mold compound encapsulating at least the semiconductor die.

9. The semiconductor device of claim 8, wherein the top semiconductor package or the top die comprises a leadless package.

10. The semiconductor device of claim 7, wherein the ring structure has a height of 50 μm to 180 μm and a width from 50 μm to 200 μm.

11. The semiconductor device of claim 7, wherein the ring structure is fully continuous throughout and comprises copper.

12. The semiconductor device of claim 8, wherein the top semiconductor package or top die comprises at least one of a vertical cavity surface emitting laser (VCSEL) die, capacitor, resistor, sensor, or an inductor.

13. The semiconductor device of claim 7, wherein the semiconductor die comprises a wafer chip scale package (WCSP) die.

14. A semiconductor device, comprising:
a package substrate;
a semiconductor die including a semiconductor surface comprising circuitry electrically connected to top-level bond pads, the top-level bond pads including inner bond pads and outer bond pads positioned beyond the inner bond pads, with solder on at least the inner bond pads, with the semiconductor die attached to the package substrate; and
a ring structure positioned around a location of at least the inner bond pads, wherein the package substrate comprises a leadframe comprising a die pad and a plurality of leads, further comprising bond wires between the plurality of leads and solders other than the solder on the inner bond pads.

15. A semiconductor device, comprising:
a package substrate;
a semiconductor die including a semiconductor surface comprising circuitry electrically connected to top-level bond pads, the top-level bond pads including inner bond pads and outer bond pads positioned beyond the inner bond pads, with solder on at least the inner bond pads, with the semiconductor die attached to the package substrate;
a ring structure positioned around a location of at least the inner bond pads
a top semiconductor package or top die including bonding features, where the bonding features are flipchip attached to the solder on the inner bond pads, wherein the top semiconductor package or the top die comprises the VCSEL die, wherein the mold compound includes an opening configured for allowing light from the VCSEL die to be emitted from a top side of the semiconductor device, and
a mold compound encapsulating at least the semiconductor die.

16. A semiconductor device, comprising:
a package substrate;
a semiconductor die including a semiconductor surface comprising circuitry electrically connected to top-level bond pads, the top-level bond pads including inner bond pads and outer bond pads positioned beyond the inner bond pads, with solder on at least the inner bond pads, with the semiconductor die attached to the package substrate;

a ring structure positioned around a location of at least the inner bond pads;

wherein the package substrate comprises a leadframe including a die pad and a plurality of leads, wherein the semiconductor die comprises a wafer chip scale package (WCSP) die including a redirect layer (RDL) that provides the inner bond pads and the outer bond pads which are both electrically connected to die bond pads that are electrically connected to the circuitry, the WCSP die attached top side up on the die pad;

wherein the ring structure comprises copper;

further comprising bond wires between the outer bond pads and the plurality of leads; and wherein the top semiconductor package or the top die is electrically connected exclusively to only the solder on the inner bond pads.

17. A semiconductor die, comprising:

a semiconductor surface comprising circuitry electrically connected to top-level bond pads exposed on a top surface of the semiconductor die, the top-level bond pads including inner bond pads and outer bond pads positioned beyond the inner bond pads, with solder on at least the inner bond pads; and a first ring structure positioned around a location of one of the inner bond pads and a second ring structure positioned around a location of another of the inner bond pads.

18. The semiconductor die of claim 17, wherein each ring structure has a height of 50 µm to 180 µm and a width from 50 µm to 200 µm.

19. The semiconductor die of claim 17, wherein the semiconductor die includes a top layer metal that includes die bond pads which provide the inner bond pads and the outer bond pads that are both electrically connected to the circuitry.

20. The semiconductor die of claim 17, wherein each ring structure provides a fully continuous encirclement of a respective bond pad.

21. The semiconductor device of claim 17, wherein the semiconductor die comprises a wafer chip scale package (WCSP) die.

22. The semiconductor device of claim 17, wherein the ring structures are fully continuous throughout and comprise copper.

* * * * *